United States Patent [19]

Backes

[11] Patent Number: 4,518,872
[45] Date of Patent: May 21, 1985

[54] MOS TRANSITION DETECTOR FOR PLURAL SIGNAL LINES USING NON-OVERLAPPING COMPLEMENTARY INTERROGATION PULSES

[75] Inventor: Reiner Backes, Freiburg-Tiengen, Fed. Rep. of Germany

[73] Assignee: ITT Industries, Inc., New York, N.Y.

[21] Appl. No.: 467,620

[22] Filed: Feb. 17, 1983

[30] Foreign Application Priority Data

Mar. 4, 1982 [EP] European Pat. Off. ........ 82101667.2

[51] Int. Cl.[3] .................. H03K 19/096; H03K 17/693
[52] U.S. Cl. .................................... 307/448; 307/449; 307/453; 307/242; 307/247 R; 365/230
[58] Field of Search ............... 307/448, 449, 453, 463, 307/353, 242, 247 R, 571, 582; 340/804; 365/230

[56] References Cited

U.S. PATENT DOCUMENTS

| | | | |
|---|---|---|---|
| 4,039,858 | 8/1977 | Stewart | 307/353 X |
| 4,176,287 | 11/1979 | Remedi | 307/463 |
| 4,286,174 | 8/1981 | Dingwall | 307/242 |
| 4,350,905 | 9/1982 | Sato | 307/449 X |
| 4,420,695 | 12/1983 | Fisher | 307/242 |

Primary Examiner—Stanley D. Miller
Assistant Examiner—D. R. Hudspeth
Attorney, Agent, or Firm—Donald J. Lenskzus

[57] ABSTRACT

The circuit provides a signal (a) at the application of an interrogation pulse (as) if a change of state has occurred in a one-out-of-n system until the instant of interrogation. Each signal (1 ... n) of the system is assigned an arrangement having storage capability and comprising two inverters (i1, i2) with feedback and two series-connected transistors (t2, t3) which are both conducting at the instant of interrogation and, thus, produce an unambiguous signal level at a common load resistor (l) only if a change of state has occurred in the system.

1 Claim, 1 Drawing Figure

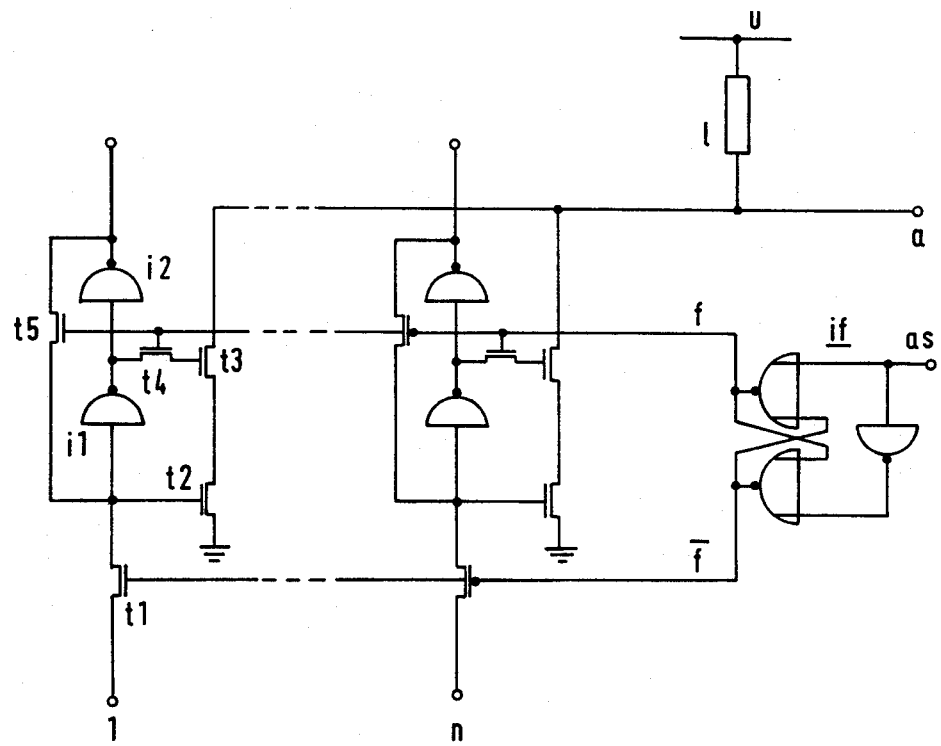

MOS TRANSITION DETECTOR FOR PLURAL SIGNAL LINES USING NON-OVERLAPPING COMPLEMENTARY INTERROGATION PULSES

The present invention relates to an insulated-gate field effect transistor integrated circuit, i.e., an MOS integrated circuit, for delivering a digital signal at the application of an interrogation pulse if a change of state has occurred in a one-out-of-n system until the instant of interrogation.

The object of the invention as characterized in the claim is to provide an MOS circuit of the above kind, for which there is an occasional need in practice.

The invention will now be explained in more detail with reference to the accompanying drawing, which is a schematic circuit diagram of one embodiment of the invention. Of the one-out-of-n system, the stages for the first signal 1 and the last signal n are shown. These signals are applied to the corresponding terminals. Each signal is applied via the channel of the first transistor t1 to the input of the first inverter i1 and to the gate of the second transistor t2, whose channel is grounded at one end, while the other end is connected via the channel of the third transistor t3 to the load device l, which is common to all signals 1 . . . n.

The other terminal of the load device l is connected to the supply-voltage source u. The load device is either an enhancement-mode transistor or a depletion-mode transistor of the same conductivity type as the transistors mentioned.

The output of the first inverter i1 is connected to the input of the second inverter i2 and, via the channel of the fourth transistor t4, to the gate of the third transistor t3. The input of the first inverter i1 is connected to the output of the second inverter i2 via the channel of the fifth transistor t5.

The interrogation pulse as is applied to the pulse shaper if, which produces two nonoverlapping clock signals f, f̄ therefrom. In the embodiment shown in the drawing, the pulse shaper if consists of two NOR gates which are cross-coupled in the manner shown, and one of which has an inverter connected ahead of one of its inputs.

The first clock signal f produced by the pulse shaper if is applied to the gates of the fourth transistor t4 and the fifth transistor t5, while the second clock signal f̄ is applied to the gate of the first transistor t1.

For the explanation of the operation of the circuit, positive logic is assumed. In the absence of the interrogation pulse as, the second clock signal f̄ is thus at L level (the more negative of the two binary-signal levels H, L), so that the first transistor t1 is off, and the signal 1 . . . n as applied during the last interrogation pulse as is stored by the inverters i1, i2 as the transistor t5 is conducting.

When the next interrogation pulse as is applied, the second clock signal f̄ assumes a H level and the first clock signal f assumes a L level, whereby the fourth and fifth transistors t4, t5 are turned off, and the first transistor t1 becomes conducting. As a result, the instantaneous level of the signal 1 . . . n is applied to the gate of the second transistor t2, while the inverted level of the signal 1 . . . n at the time of the preceding interrogation pulse as remains stored on the gate of the third transistor t3.

If one of the signals 1 . . . n has changed from L to H between these two interrogation pulses, the series combination of the transistors t2, t3 becomes conducting, so that the output a is at a L level, which signals that a change of state has taken place in the one-out-of-n system 1 . . . n. If necessary, this L level can be converted to a H level by means of an additional inverter.

The fifth transistor t5 causes the binary level stored in the arrangement to be retained in the absence of interrogation pulses irrespective of any change of state; such a change does not lead to a change of state at the output of the first inverter i1 until an interrogation pulse as is applied.

The circuit according to the invention has the advantage of taking up little chip area even for a one-out-of-n system with a larger number n, because only the chip area for two inverters and five additional MOS transistors is required for each signal of the one-cut-of-n system. A rather small-area "interrogation cell" is thus obtained. Another advantage is that the circuit of this interrogation cell has storage capability, so that the stored signal can be obtained from the output of the second inverter i2 for further functions, as is indicated in the drawing.

The five transistors t1 . . . t5 and the transistors with which the two inverters i1, i2 are implemented are all of the same conductivity type.

I claim:

1. Insulated-gate field-effect transistor integrated circuit for delivering a digital signal (a) at the application of an interrogation pulse (as) if a change of state has occurred in a one-out-of-n system until the instant of interrogation, characterized by the following features:

each signal (1 . . . n) of the one-out-of-n system is applied via the channel of a first transistor (t1) to the input of a first inverter (i1) and to the gate of a second transistor (t2) whose channel is grounded at one end, while the other end is connected via the channel of a third transistor (t3) to a load device (l) common to all signals (1 . . . n) and connected to a supply-voltage source (u);

the output of the first inverter (i1) is connected to the input of a second inverter (i2) and, via the channel of a fourth transistor (t4), to the gate of the third transistor (t3);

the input of the first inverter (i1) is connected to the output of the second inverter (i2) via the channel of a fifth transistor (t5);

the interrogation pulses (as) are applied to a pulse shaper (if) which produces two nonoverlapping clock signals (f, f̄) therefrom;

the first clock signal (f) is applied to the gates of the fourth and fifth transistors (t4, t5), and the second clock signal (f̄) is applied to the gate of the first transistor (t1).

* * * * *